June 29, 1971 J. M. SHAHEEM 3,589,004

PROCESS OF MAKING REINFORCED FLAT CABLE TERMINATIONS

Filed Sept. 13, 1968 4 Sheets-Sheet 1

INVENTOR.
JOSEPH M. SHAHEEN

BY Edward Dugas

ATTORNEY

PROCESS OF MAKING REINFORCED FLAT CABLE TERMINATIONS

Filed Sept. 13, 1968 4 Sheets-Sheet 2

INVENTOR.
JOSEPH M. SHAHEEN
BY Edward Dugas
ATTORNEY

June 29, 1971 J. M. SHAHEEM 3,589,004

PROCESS OF MAKING REINFORCED FLAT CABLE TERMINATIONS

Filed Sept. 13, 1968 4 Sheets-Sheet 3

INVENTOR.
JOSEPH M. SHAHEEN
BY Edward Dugas
ATTORNEY

PROCESS OF MAKING REINFORCED FLAT CABLE TERMINATIONS

Filed Sept. 13, 1968

INVENTOR.
JOSEPH M. SHAHEEN
BY Edward Dugas
ATTORNEY

United States Patent Office 3,589,004

Patented June 29, 1971

3,589,004

PROCESS OF MAKING REINFORCED FLAT CABLE TERMINATIONS

Joseph M. Shaheen, La Habra, Calif., assignor to North American Rockwell Corporation

Filed Sept. 13, 1968, Ser. No. 759,592
Int. Cl. B41m *3/08;* H05k *3/00*
U.S. Cl. 29—625 2 Claims

ABSTRACT OF THE DISCLOSURE

The disclosure is a method of making reinforced circuitry terminations in flexible copper foil circuits wherein reinforcing material, such as epoxy glass, is applied to each side of the flexible circuitry termination and a thin layer of metal is bonded on the layer of reinforcing material. Holes are then punched or drilled through the layers and the flexible circuitry. The holes are then metal plated by an electroless process or a combination of electroless and electroplating. The holes and select areas around the holes are then plated with gold or other acid resist material to provide an etch resistant surface. The first metal clad coating is etched off. The reinforcing material is then pattern etched to provide a reinforced circuit termination which is flexible between terminations.

BACKGROUND OF THE INVENTION

This invention relates to flexible circuitry and especially to flat flexible cable of the type now being used in the electronics field. These flexible cables are used in complex electronic equipment in which the failure of one conductor or the separation of a conductor from a terminal can result in a loss of the equipment function. Although there are many advantages to be achieved in using the cable, these advantages have been overcome by the fact that in the cable termination area, both the insulation and the conductors are breaking. One prior art patent directed toward this problem is U.S. Pat. No. 3,325,691, entitled "Flexible Printed Circuitry Terminations" by V. F. Dahlgren et al. In that patent, there is described a method of forming circuit termination using grommeted tubelets which are brazed to the internal conductor. The tubelet is subjected to mechanical distortion both in the application and the use stage. The grommeted terminal is structurally unreinforced which allows it to bend with respect to the conductor, thereby causing fatigue of the electrical connection.

Another prior art patent of interest is U.S. Pat. No. 3,221,095, entitled "Flexible Connecting Terminal Assembly" by V. B. Cook. In that patent, eyelets are attached to the conductors to form the terminations. When the cable is assembled, solder temperatures melt the insulation around the eyelets causing the termination to become mechanically weaker, or melt the solder fillet used to make electrical contact, thereby causing a potential cold joint. The present invention provides a method for reinforcing the termination and for increasing the thermal path between the termination and the conductor insulation.

SUMMARY OF THE INVENTION

In a preferred method of the invention, an insulating path is etched around a desired copper foil circuit with the foil supported on a layer of flexible insulating material. A second layer of flexible insulating material is laminated to the first layer sandwiching the foil circuit therebetween. A layer of reinforcing material having one major surface thereof clad with a metal conductor is laminated to each flexible insulating layer with the clad surface positioned furthest from the foil conductor. Holes are made through the layers and the foil at positions corresponding to the positions of desired termination. The holes are then plated with metal. An acid resist material is then applied to areas around the holes which are desired to be retained. The unprotected plated areas and the clad layers are then etched away. The unprotected insulating reinforcing layers which supported the clad layer are then pattern etched to provide the finished reinforced terminations.

It is therefore an object of the present invention to provide an improved circuit termination.

It is another object of the present invention to provide a circuit termination particularly adaptable to a flexible circuit.

It is a further object of the present invention to provide a flexible circuit termination which is rigidly supported with respect to the circuit conductor.

It is another object of the present invention to provide a conductor termination which has improved thermal insulating properties.

These and other objects of the present invention will become more apparent and better understood when taken in conjunction with the following description and drawings, throughout which like characters indicate like parts, and which drawings form a part of this application.

DESCRIPTION OF THE PREFERRED EMBODIMENTS

Figure 1A:
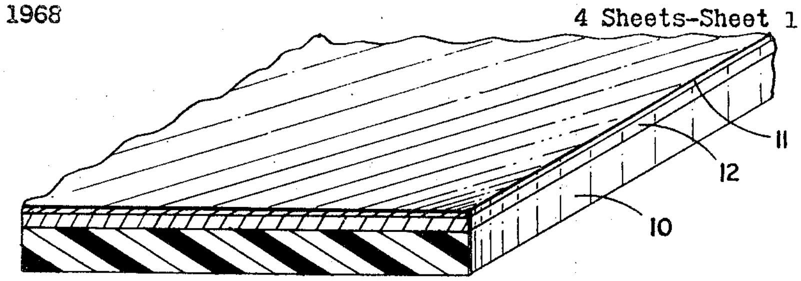
FIGS. 1*a*–1*j* pictorially illustrate a flow chart of a method for making the invention by depicting a sample flexible circuit in various stages of fabrication. These drawings are not to scale, but have been distorted in an attempt to make normally small details as understandable as possible.
Figure 1B:
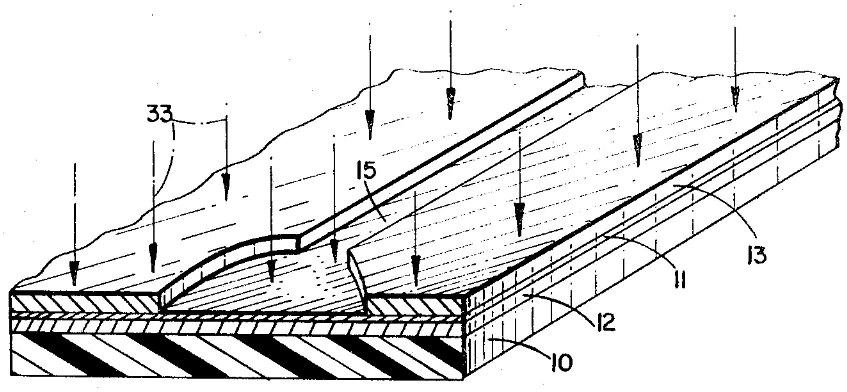

Referring to FIG. 1*a*, the first step in making a reinforced termination is to take a flexible insulator sheet 10 clad on one side with a copper foil 12 and clean the exposed copper surface in a solution of hydrochloric acid (HCl) for about 15 seconds. It is then rinsed in deionized water and coated with a photoresist film 11. The photoresist film may be an emulsion, such as bichromated colloid or a resinous ester of maleic anhydride polymer with w-hydroxyalkoxy-acetophenones. The emulsion may be deposited by flow techniques and allowed to dry in an oven at approximately 110° C. for about 10 minutes. Upon being exposed to ultraviolet light, the photosensitive emulsion hardens to form an acid resist. The second step depicted in FIG. 1*b* includes photo exposing the film of emulsion 11 with ultraviolet light for three to five minutes through a positive plate 13 of a pattern of a desired circuit conductor 15 and an enlarged termination area. The exposed emulsion is then developed 10 to 15 minutes in a suitable solvent removing the unexposed emulsion and rinsed in a solution of methylethylketone. The assembly is then dried for about 10 minutes at an elevated temperature of approximately 100° C.

Figure 1C:
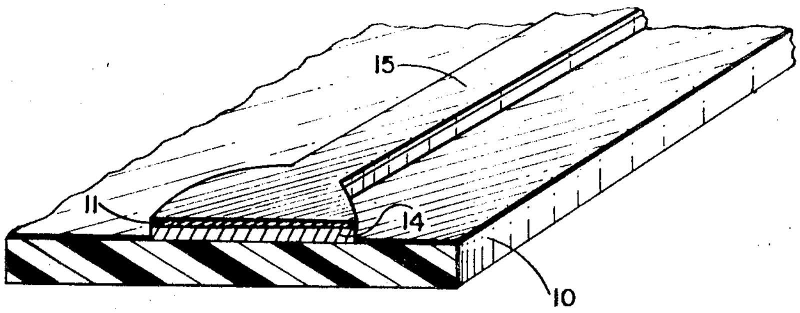

The third step depicted in FIG. 1*c* consists of etching the pattern in the copper foil 12 with a solution of ferric chloride ($FeCl_3$) which will not dissolve the exposed acid resist layer 11 on the insulating material 10. The emulsion layer 11 may be removed if desired or it may be left on at the discretion of the manufacturer.

It should be understood that the materials described herein are illustrative and that other materials may be employed to practice the invention, keeping in mind only that the solution employed for etching the conductive material of the sheet 12 should not materially dissolve the insulating material 10 and that the solution employed for etching the insulating material in the to-be-described following steps should not materially dissolve the conductive material. Various types of conductive material may be used with varying degrees of success. Some of the more preferred conductive materials are nickel, gold-plated copper, solder-plated copper and tin-plated copper. Some of the materials that may be used for the insulators are Mylar, FEP–Teflon, TFE–Teflon and flexible epoxy glass.

Figures 1G, 1H:
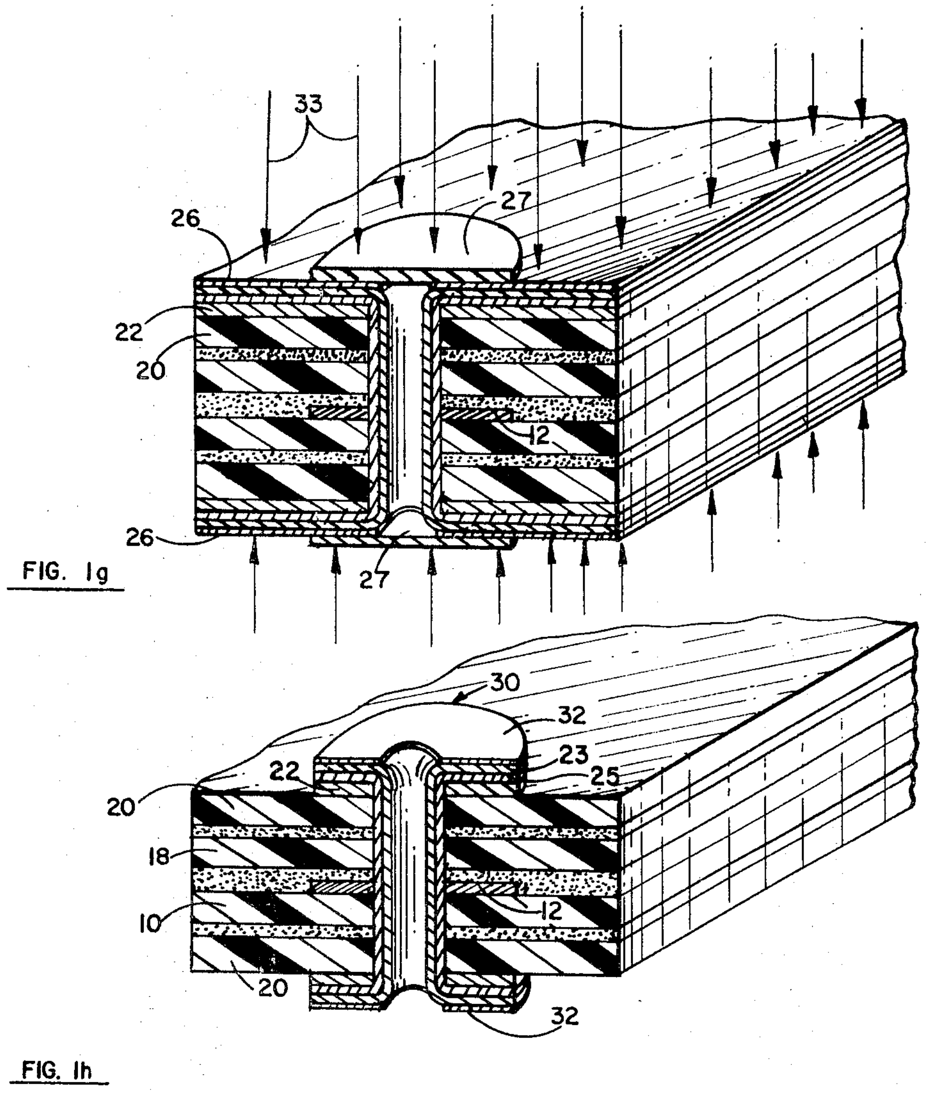
Figure 1I:
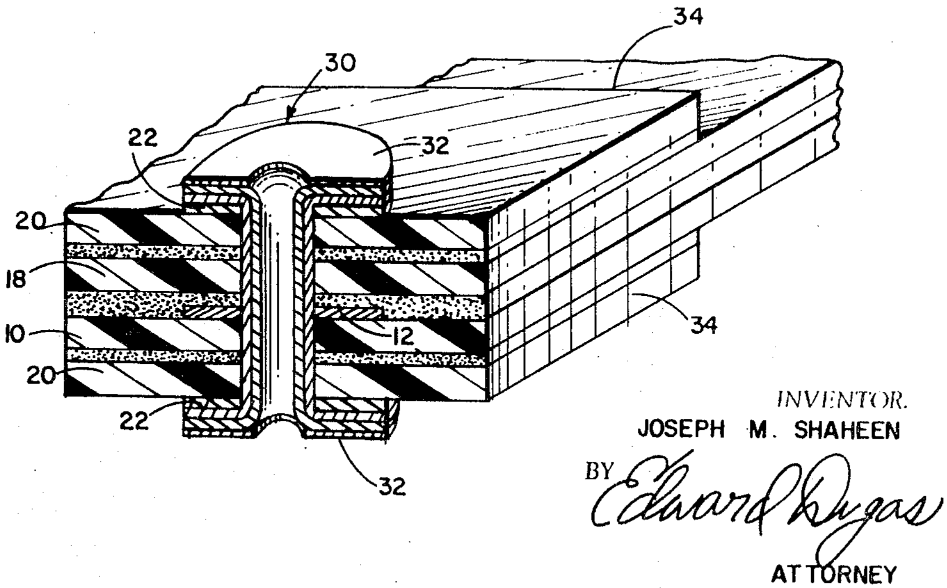
Figure 1J:
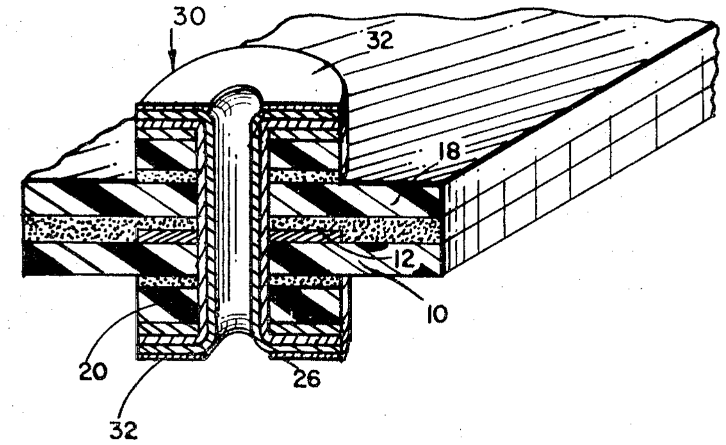
Figure 1D:
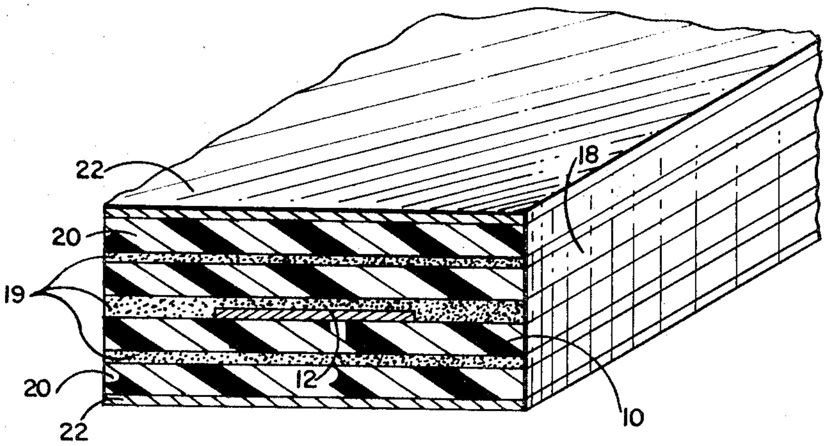

In FIG. 1*d*, a non-clad flexible insulating layer 18 is laminated over the etched circuit 14 and held in place by means of an adhesive 19. A pair of epoxy glass sheets 20 clad on one side with a metal film 22 are positioned sandwiching the insulating sheets 10 and 18 with layers of adhesive 19 positioned between each sheet to enable the entire assembly to be laminated together. The clad layers 22 are positioned furthermost from the foil 12.

Figure 1E:
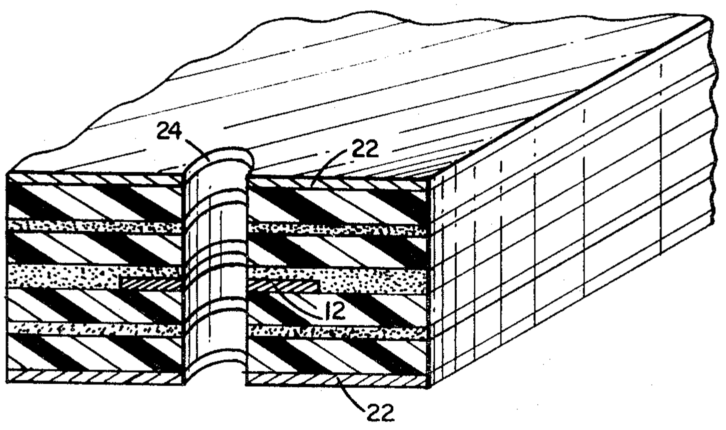

In FIG. 1*e*, a hole 24 is drilled or punched through the assembled layers and the foil at a position corresponding to the desired terminations.

Figure 1F:
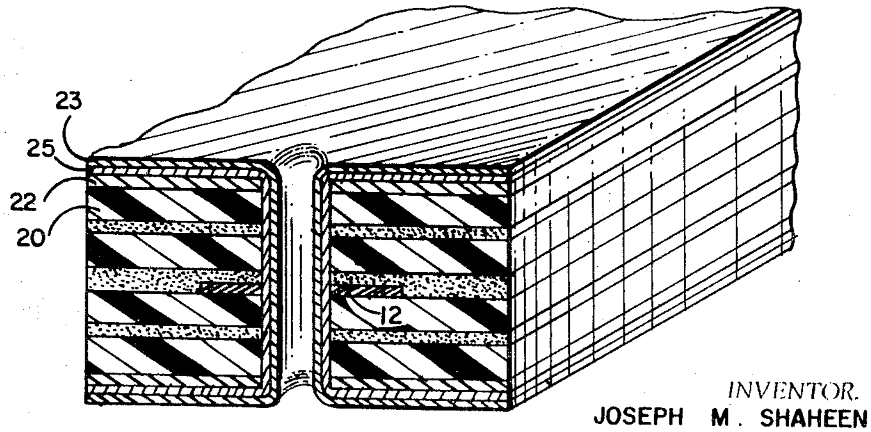

In FIG. 1*f*, the hole 24 is electroless plated with copper using plating procedures well known to those persons in the plating art. For an example, U.S. Pat. No. 3,269,861 entitled "Method for Electroless Copper Plating" by F. W. Schenble, Jr. et al. discloses an outer metal clad wherein an electroless method may be used for the plating step of this invention. Layers 22 also receive a thin layer of electroless-plated copper 25. Additional strength can be provided by electroplating an additional layer of metal 23 onto the electroless layer 25.

In FIG. 1*g*, a layer of photoresist film 26 is applied to each surface of the laminated areas. Positive masks 27 are then positioned over the photosensitive film 26 to define the pattern of the termination support ridges which will be plated subsequently with a metal etch resist such as Sn. The photosensitive film 26 is then exposed to the ultraviolet light 33 in those areas where the mask does not prevent the light from passing through. The exposed film is then developed ten to fifteen minutes in a suitable solvent and the board is then plated with a metal etch resist such as Sn. The board is then etched using chromic/sulfuric acid etchants.

In FIG. 1*h*, the electroless layer 25 and the electroplated layer 23, along with the copper-clad layer 22, is removed exposing the insulating layers 20. The metal layers are thereby removed from all areas except those areas covered by the exposed and hardened film. A plated through grommet type termination 30 is thus formed. The flat surfaces of the grommet 32, which in the soldering process receives the most heat, are separated by a layer of epoxy glass from the softer and more sensitive flexible insulating layers 10 and 18 and the circuit conductor 14. The epoxy layers are structurally rigid thereby providing additional structural support for the termination 30. If the entire laminated structure has been formed for use as a flexible cable, it is then necessary to mask off an additional area 34 as shown in FIG. 1*i* around the formed termination 30, leaving enough material to provide the added support. The remainder of the material is etched away by use of a solution of $H_2SO_4$/HF. Examples of specific solutions that may be used to etch the epoxy glass are disclosed in U.S. Pats. 3,276,106 and 3,276,927. In some applications, it may not be desirable to maintain a large stiff area around the reinforced circuit terminations. In that case, the step shown in FIG. 1*j* may be substituted for the step shown in FIG. 1*i*. Instead of masking the epoxy glass area, the layer is etched with the masking being provided by a relatively flat ends 32 of the termination.

Figure 2:
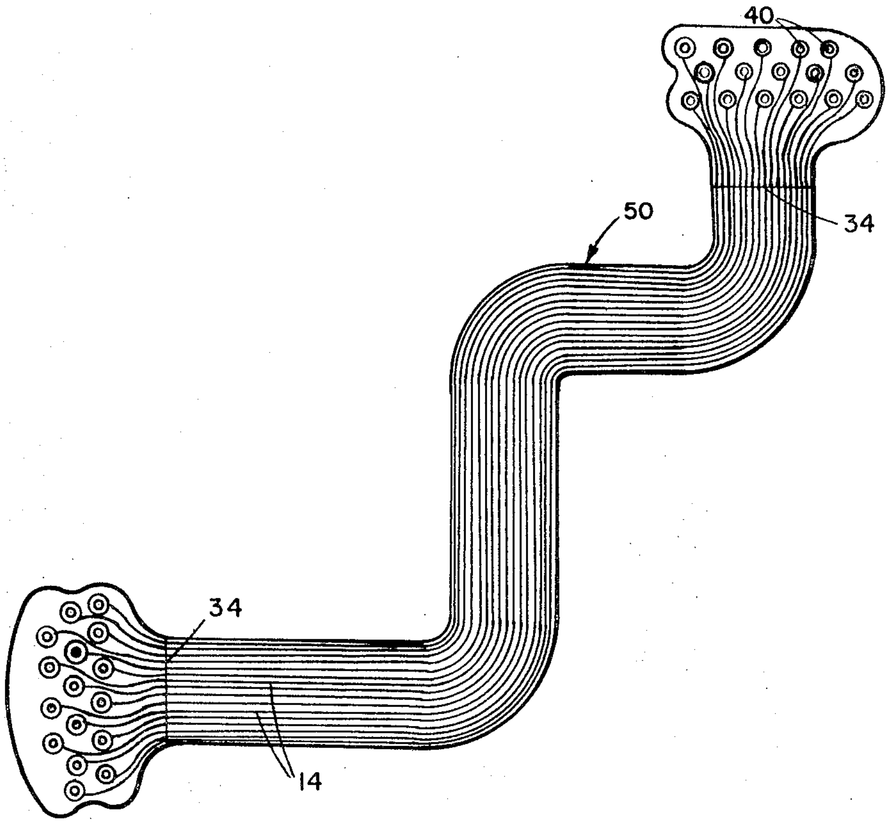
FIG. 2 illustrates a finished flexible circuit with terminations made with the method of this invention.

Referring now to FIG. 2 wherein a plurality of terminations 40 are shown at the end of a multi-conductor flexible cable 50, the ends of the flexible cable in this particular application were reinforced by applying a mask over the epoxy glass layers to prevent their being etched away from around the terminations 40; the etching proceeded, though, along the length of the cable to make a cable which is flexible between each group of end terminations but which is substantially rigid between each termination of an end group.

While there has been shown what is considered to be the preferred embodiment of the invention, it will be manifest that many changes and modifications may be made therein without departing from the essential spirit of the invention. It is intended, therefore, in the annexed claims, to cover all such changes and modifications as may fall within the true scope of the invention.

What is claimed is:

1. In a method of making a cable which has a flexible body and at least one group of connection points affixed at at least one location of said cable, said group of connection points being rigid relative the flexibility of said body, said cable, having conductors laminated to insulations throughout its entire length, comprising the steps of:

etching a conductive path in a copper foil conductor which is supported on a layer of insulating material;

attaching a layer of insulating material over each of the etched conductors;

laminating a sheet of reinforcing insulating material, which has one surface thereof clad with conductive material, to each of the metal clad surfaces which are farthest from said etched conductors thereby providing a laminate formation;

forming holes through the laminate formation at positions corresponding to desired connection points;

interconnecting the various conductive layers by plating said holes and surfaces exterior to the laminate formation with conductive metal;

masking areas desired to be plated around said holes;

providing metal resist film on said areas and in said holes and etching the unprotected portions of the surfaces exterior to the laminate formation and portions of the clad conductive material on said reinforcing insulating material; and removing the reinforcing insulating material sheets throughout the length of the cable excepting at said connection points by etching.

2. A method of making a cable having a flexible body and at least one group of connection points affixed at at least one location of said cable, said group of connection points being rigid relative the flexibility of said body, said cable having conductors laminated to insulators throughout its entire length, comprising the steps of:

applying photosensitive layer on a surface of a flexible conductor sheet, said flexible conductor sheet being laminated to a first sheet of flexible insulating material;

exposing the photosensitive layer through a photographic plate having a pattern of predetermined cable conductor and termination shapes thereon and developing the exposed portions of the photosensitive layer;

etching an electrically conductive pattern in accordance with the predetermined pattern of the photographic plate resulting in the conductors and connection point shapes;

laminating a second sheet of flexible insulating material to said first sheet and to said electrically conductive pattern to render a conductive envelope and then laminating a pair of rigid sheets having electrically conductive material clad on one surface of each said sheet with the unclad surfaces of the rigid sheets being attached to the exterior surfaces of the said envelope wherein said exterior surfaces are parallel to the electrically conductive pattern, thereby forming a laminate;

forming apertures in the laminate, orthogonally therethrough at the connection point shapes;

plating the walls of said apertures and surfaces extending radially from the apertures on the exterior of the laminate with a first plating material thereby resulting in an electrical connection of the plated apertures to the connection point shapes, thereby forming a connection point at each of said apertures;

plating the outer surfaces of each connection point and the walls of said apertures with a second plating material;

removing those portions of the clad surfaces of electrically conductive material which clad surfaces have the first plating material thereon and which have not been plated with the second plating material; and removing portions of the rigid sheets throughout the entire length of the cable except at the connection points thereby resulting in said cable having connection points which are rigid and a body which is flexible as compared with the rigidity of the connection points.

References Cited

UNITED STATES PATENTS

| | | | |
|---|---|---|---|
| 3,102,213 | 8/1963 | Bedson et al. | 29—628UX |
| 3,186,883 | 6/1965 | Frantzen | 156—3X |
| 3,319,317 | 5/1967 | Roche et al. | 174—68.5X |
| 3,448,516 | 6/1969 | Buck | 174—68.5X |
| 3,383,564 | 5/1968 | Lulmond et al. | 29—625UX |
| 3,409,732 | 11/1968 | Dahlgren et al. | 29—625X |

JOHN F. CAMPBELL, Primary Examiner

R. W. CHURCH, Assistant Examiner

U.S. Cl. X.R.

29—628R, 626R; 156—3R; 174—68.5R; 339—17F